United States Patent [19]
Bevacqua

[11] 3,965,449
[45] June 22, 1976

[54] TREADLE BAR DRIVEN POTENTIOMETER

[75] Inventor: Louis Albert Bevacqua, Des Plaines, Ill.

[73] Assignee: Motorola, Inc., Schaumburg, Ill.

[22] Filed: July 16, 1975

[21] Appl. No.: 596,344

[52] U.S. Cl. .................................. 334/7; 334/15
[51] Int. Cl.$^2$ ........................................ H03J 5/08
[58] Field of Search .................. 334/7, 15; 338/153

[56] References Cited
UNITED STATES PATENTS

| | | | |
|---|---|---|---|
| 3,662,295 | 5/1972 | Rummer | 334/7 |
| 3,739,307 | 6/1973 | Maugans | 334/15 X |
| 3,792,387 | 2/1974 | Arrington et al. | 334/7 |

Primary Examiner—Paul L. Gensler
Attorney, Agent, or Firm—James W. Gillman; Donald J. Lisa

[57] ABSTRACT

A rotary wiper contact supported on a hub is housed between a substrate having a resistive element and a bracket means to form a potentiometer subassembly. The bracket and substrate are fixedly mounted to a pushbutton tuner frame with the hub of the wiper contact directly mounted on the treadle bar for integral movement therewith. Actuation of any pushbutton or the manual tuning shaft to select a predetermined frequency rotates the treadle bar and the wiper contact varying the effective resistance of the potentiometer which controls the voltage of a varactor to tune the receiver.

8 Claims, 2 Drawing Figures

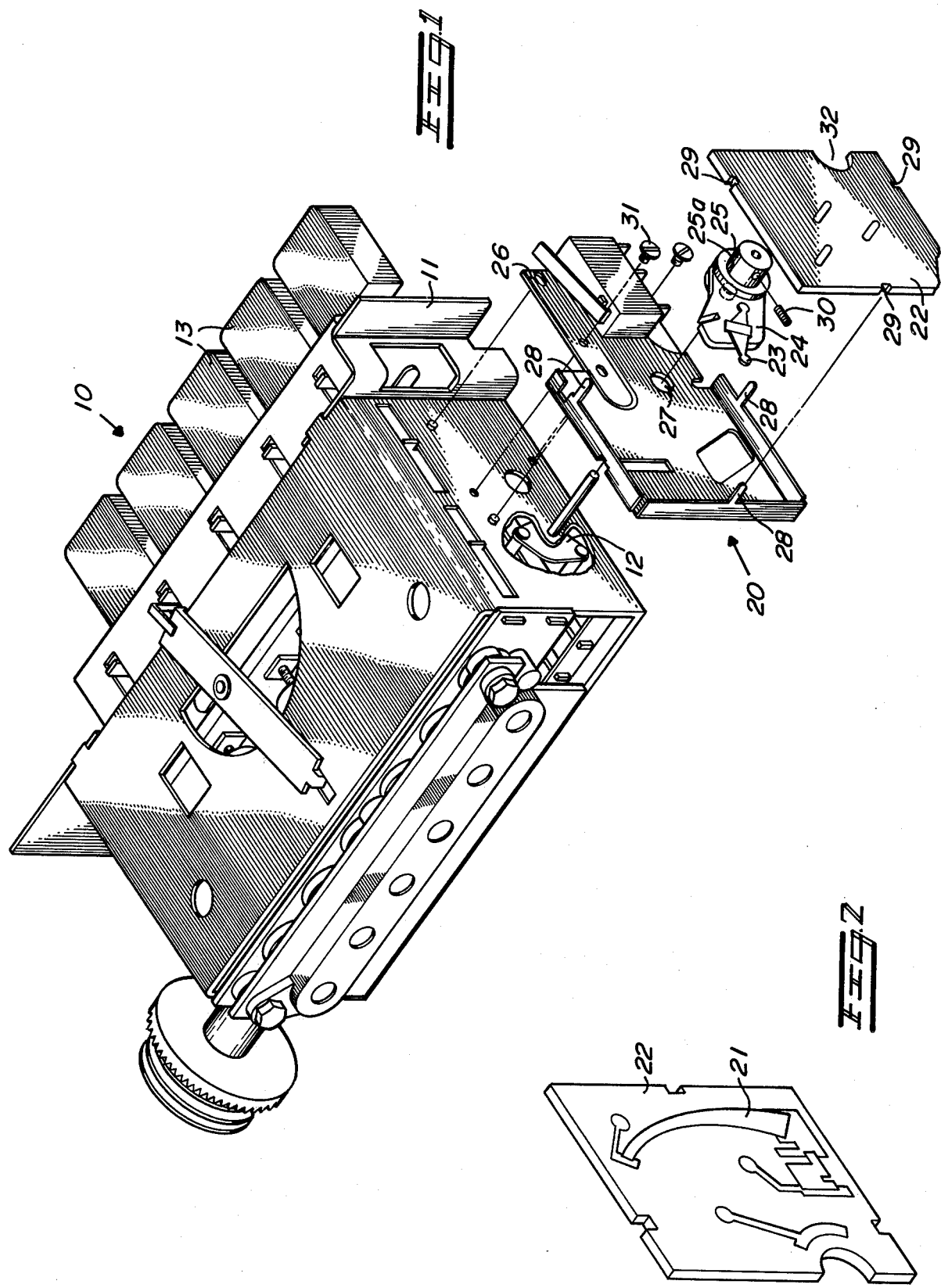

TREADLE BAR DRIVEN POTENTIOMETER

FIELD OF THE INVENTION

This invention relates to voltage dependent pushbutton turners, and particularly to such turners where the output voltage for tuning the receiver is from a potentiometer which is driven by the treadle bar.

BACKGROUND OF THE INVENTION

Radio receivers are conventionally tuned by pushbuttons which move the treadle bar. The treadle bar typically drives a carriage to move slugs within coils to vary the inductance in the tuning circuit to thereby tune the receiver to the predetermined frequency.

Advances in electronics technology have made possible fully electronic tuning of a receiver by simply controlling the voltage of a varactor, for example, in the tuning circuit of the receiver. It is known to use a potentiometer to provide the variable output voltage needed to control the varactor for tuning the receiver. However, it has been a continuing problem to find an efficient, durable and inexpensive arrangement for mounting the potentiometer in the tuner so that actuation of the pushbuttons for automatic tuning positions the movable elements of the potentiometer to provide the output voltage corresponding to the selected frequency. In an AM-FM receiver, for example, it has been proposed to provide a plurality of rotary potentiometers for the AM portion of a receiver and a second plurality of potentiometers for the FM portion of the receiver with appropriate gearing arrangements to couple the pushbuttons to the potentiometers and/or to the manual tuning shaft. It is also known to provide slide actuated potentiometers for each pushbutton for direct positioning of the potentiometer by the pushbutton. These solutions are expensive and very complex.

What has been needed is a mechanism which uses a single potentiometer mounted in the tuner which is responsive to actuation of any of the pushbuttons or the manual tuning shaft. The solutions that have been offered prior to this invention using a single potentiometer provide too much backlash (lost motion).

Further disadvantages of all of the aforesaid proposed solutions include too much driving force applied to the pushbuttons or manual tuning shaft and excessive additional parts which make the manufacturing costs prohibitive. For example, typical solutions which have been proposed required independent bearings supporting the potentiometer in addition to the bearings already provided in the tuner which support the treadle bar.

SUMMARY OF THE INVENTION

Accordingly, it is an object of the present invention to provide a potentiometer for controlling the voltage applied to a varactor to tune a radio in which the potentiometer is connected to the treadle bar for rotation therewith and supported thereby eliminating lost motion, the need for independent bearing supports for the potentiometer and complex gearing arrangements for responding to pushbutton actuation.

Briefly, the invention is in a voltage dependent type tuner which has a tuner frame, a treadle bar rotatably mounted in the frame and a plurality of pushbutton tuning slides mounted in the frame for rotating the treadle bar to repeatably select predetermined frequencies and a variable resistance or potentiometer to provide an output voltage proportional to the frequency selected by any of the pushbuttons or the manual tuning shaft. The potentiometer is formed with a resistive element supported on a substrate and a rotary wiper contact electrically insulated from but supported on a hub which is directly mounted on the treadle bar for rotation therewith in response to either pushbutton actuation or manual tuning shaft rotation. The wiper contact and resistive element are electrically configured to vary the output voltage of the potentiometer to control a varactor in the tuning circuit of the radio to tune the radio to the selected frequency.

DESCRIPTION OF THE DRAWINGS

FIG. 1 is an oblique perspective drawing of a pushbutton tuner with a potentiometer shown in exploded perspective directly connected to the treadle bar.

FIG. 2 is a plan view of the substrate supporting the resistive element showing its electrical configuration.

DESCRIPTION OF THE PREFERRED EMBODIMENT

FIG. 1 shows a tuner 10 including a frame 11, a treadle bar 12 rotatably mounted in the frame and a plurality of pushbuttons 13 also mounted in the frame for rotating the treadle bar to repeatably select predetermined frequencies. The construction of the tuner, treadle bar and pushbutton mechanisms is conventional and known to those skilled in the art.

Typically, in order to set a predetermined frequency on any of the pushbuttons, a pushbutton 13 is pulled outwardly and then the manual tuning shaft is rotated to tune the receiver manually to the predetermined frequency by rotating the treadle bar which positions slugs within coils in the tuner varying the inductance in the tuning circuit of the radio. Having manually set the desired frequency, the pushbutton 13 is then pushed inwardly thereby setting a memory cam against the treadle bar and locking the cam in position. Should the treadle bar be moved to a new location tuning the receiver to a different frequency, and it is desired to automatically set the receiver to the frequency memorized by the pushbutton cam, one simply pushes in the pushbutton which automatically moves the treadle bar to the location memorized by the pushbutton memory mechanism, thereby tuning the receiver to the memorized frequency.

Also shown in FIG. 1 is a potentiometer 20 which comprises a variable resistance means for providing an output voltage proportional to the frequency selected by any of the pushbuttons. The output voltage from the potentiometer 20 is electrically coupled to a varactor (not shown) or other component for electronically tuning the radio in a manner known in the art. Potentiometer 20 includes a resistive element 21 mounted on a substrate 22 and a wiper contact 23 mounted on a rotor 24 made of an insulative material and supported on a hub 25. Potentiometer 20 further includes a mounting bracket 26 having an aperture 27 therein for receiving the hub 25 so that the latter can be mounted directly onto the shaft of treadle bar 12. The wiper contact, being mounted directly to the treadle bar is supported thereon and moves therewith in response to either pushbutton actuation or rotation of the manual tuning shaft. As is known in the art, movement of the wiper contact across resistive element 21 shunts a portion of the resistance and varies the effective output voltage of the potentiometer which is then applied to the varactor to tune the radio.

Bracket 26 is formed with tabs 28 which are received by notches 29 of the substrate 22 and are then bent over substrate 22 to form a subassembly of the potentiometer which is independent of the tuner 10. The action of sandwiching wiper contact 23 between bracket 26 and substrate 20 loads the contact 23 against resistive element 21 to provide good electrical contact.

Potentiometer 20 is mounted to treadle bar 12 by slipping hub 25 onto the shaft of treadle bar 12 and then setting set screw 30. Bracket 26 is adapted for being fixedly mounted to the side wall of the tuner by any means such as screws 31.

Aperture 27 of bracket 26 and cutout 32 of substrate 22 are dimensioned relative to the outside diameter of hub 25 to provide a radial clearance to allow for any misalignment between the resistive element 21 and wiper contact 23 during assembly.

The invention further includes a means for adjusting the circumferential position of the rotary wiper contact relative to the resistive element for initially aligning the same electrically relative to a predetermined output voltage. This is accomplished by releasably frictionally mounting hub 25 within aperture 25a of rotor 24. During assembly, when the potentiometer has been assembled to the treadle bar and set screw 30 is set, the treadle bar and hub 25 can be positioned in a predetermined location and rotor 24 can be forcibly moved relative to the hub 25 and the resistive element 21 to initially align the set electrically. Thereafter, the rotor 24 always moves integrally with the treadle bar movement in response to either pushbutton actuation or manual tuning knob rotation.

It is now apparent that the invention as described above provides a potentiometer construction directly attached to the treadle bar to form an integral assembly. Independent bearings to support rotor 24 are totally eliminated as rotor 24 is supported by the bearings of treadle bar 12. Further, lost motion due to gearing arrangements coupling rotor 24 to the treadle bar are totally eliminated as the rotor is directly mounted on the treadle bar and is integral therewith. The oversized holes in the substrate support and bracket are for ease of manufacture and permit the rotor to be piloted by the treadle bar shaft only allowing for any misalignment between the wiper contact and resistive element during manufacture and other manufacturing tolerances. The only load applied to the pushbuttons and manual tuning shaft is the back pressure from the spring wiper contact. Thus, additional loads caused by complex gearing arrangements as were known in the prior art are eliminated.

As described above, the invention is typically used in an AM-FM radio combination having conventional slug tuning for the AM portion and fully electronic varactor tuning for the FM portion. However, the invention is conceived as applying equally to a single AM or FM radio or to an AM-FM radio combination which has no slug tuning whatsoever and is fully electronically tuned.

What has been described is a preferred embodiment of the invention. Other variations are possible and such variations which are the equivalent of the invention defined in the claims below are intended to be included within the scope of the invention described.

I claim:

1. Voltage dependent type tuner comprising
a tuner frame,
treadle bar means rotatably mounted in the frame,
a plurality of pushbutton tuning means mounted in the frame for rotating the treadle bar to repeatably select predetermined frequencies
wherein the improvement comprises
variable resistance means for providing an output voltage proportional to the frequency selected by any of the pushbuttons including
a resistive element, and
a wiper contact,
the resistive element and wiper contact being movable relative to each other for varying the effective output voltage,
one of the resistive element and the wiper contact connected to the treadle bar for rotation therewith in response to pushbutton actuation.

2. Voltage dependent type tuner as claimed in claim 1 further comprising hub means for supporting the one of the resistive element and the wiper contact, support means for fixedly mounting the other of the resistive element and the wiper contact to the tuner frame, the support means having a radial clearance from the hub means to allow for misalignment between the resistive element and the wiper contact during assembly.

3. Voltage dependent type tuner as claimed in claim 1 wherein the wiper contact is secured to the treadle bar shaft and the resistive element is fixedly mounted to the tuner frame.

4. Voltage dependent type tuner as claimed in claim 1 further comprising means for loading the wiper contact and resistive element.

5. Voltage dependent type tuner as claimed in claim 1 further comprising means for adjusting the circumferential position of the wiper contact and resistive element for initially aligning the same electrically relative to a predetermined output voltage.

6. Voltage dependent type tuner as claimed in claim 2 wherein the support means includes a bracket for mounting the resistive element to the tuner frame, the wiper contact mounted between the resistive element and the bracket, an aperture in the bracket, a portion of the hub extending through the aperture for connection to the treadle bar.

7. Pushbutton tuner for a signal receiver comprising
a frame,
treadle bar means rotatably mounted in the frame,
a plurality of pushbutton mechanisms mounted in the frame for selectively rotating the treadle bar to a plurality of positions corresponding to memorized frequencies,
a rotary potentiometer for providing an output voltage for tuning the receiver including
a substrate having a resistive element thereon,
a rotor having a contact arm insulatively mounted thereon and adapted for electrically coupling with the resistive element,
means for fixedly mounting the substrate to the frame,
means for fixedly mounting the rotor to the treadle bar for varying the output voltage of the potentiometer in response to pushbutton actuation, and
means for loading the rotor and resistive element.

8. Pushbutton tuner for a signal receiver as claimed in claim 7 further comprising means for manually rotating the treadle bar and rotor independently of the pushbuttons for manually tuning the receiver to a desired frequency.

* * * * *

Disclaimer 3,965,449.—*Louis Albert Bevacqua*, Des Plaines, Ill. TREADLE BAR DRIVEN POTENTIOMETER. Patent dated June 22, 1976. Disclaimer filed Dec. 8, 1980, by the assignee, *Motorola, Inc.*

Hereby enters this disclaimer to claims 1, 3, 4, 7 and 8 of said patent.

[*Official Gazette February 17, 1981.*]